United States Patent
Song (10) Patent No.: US 6,670,652 B2
(45) Date of Patent: Dec. 30, 2003

(54) MONOLITHICALLY INTEGRATED E/D MODE HEMT AND METHOD FOR FABRICATING THE SAME

(75) Inventor: Jong-In Song, Kwangju (KR)

(73) Assignee: Kwangju Institute of Science and Technology, Kwangju (KR)

( * ) Notice: Subject to any disclaimer, the term of this patent is extended or adjusted under 35 U.S.C. 154(b) by 0 days.

(21) Appl. No.: 10/088,793

(22) PCT Filed: Oct. 13, 2001

(86) PCT No.: PCT/KR01/01729

§ 371 (c)(1),
(2), (4) Date: Mar. 22, 2002

(87) PCT Pub. No.: WO02/31886

PCT Pub. Date: Apr. 18, 2002

(65) Prior Publication Data

US 2002/0177261 A1 Nov. 28, 2002

(30) Foreign Application Priority Data

Oct. 13, 2000 (KR) .......................................... 2000-60200

(51) Int. Cl.⁷ .......................................... H01L 31/0328
(52) U.S. Cl. .......................... 257/194; 257/11; 257/12; 257/15; 257/24; 257/37; 257/138; 257/190
(58) Field of Search .............................. 257/15, 20, 22, 257/24, 27, 76, 190, 192, 194, 201, 284, 472, 615, 745; 438/149, 157, 161, 167, 172, 176

(56) References Cited

U.S. PATENT DOCUMENTS

| | | | | |
|---|---|---|---|---|
| 4,663,643 A | * | 5/1987 | Mimura | ......................... 357/22 |
| 5,959,317 A | * | 9/1999 | Niwa | .......................... 257/194 |

FOREIGN PATENT DOCUMENTS

| | | |
|---|---|---|
| JP | 57-112080 | 7/1982 |
| JP | 58-147078 | 9/1983 |
| JP | 05-182947 | 7/1993 |
| JP | 05-267256 | 10/1993 |
| JP | 09-045898 | 2/1997 |
| JP | 09-246526 | 9/1997 |
| JP | 10-098180 | 4/1998 |

OTHER PUBLICATIONS

English Abstracts of all of the above Japanese applications are included on the front of each reference.

* cited by examiner

Primary Examiner—Long Pham
Assistant Examiner—Wai-Sing Louie
(74) Attorney, Agent, or Firm—Marger Johnson & McCollom, P.C.

(57) ABSTRACT

The monolithically integrated Enhancement/Depletion mode HEMT (high-electron-mobility transistor) of the present invention comprises: a buffer layer, a channel layer, a spacer layer, a first barrier layer, a second barrier layer, a third barrier layer, and an ohmic layer consecutively formed on a semiconductor substrate from bottom to top; the first exposed region (a gate region for a Depletion-mode HEMT) formed by selective etching of the ohmic layer to expose the third barrier layer; a second exposed region (a gate region for an Enhancement-mode HEMT) formed by selective etchings of the ohmic layer and the third barrier layer to expose the second barrier layer; and gate electrodes formed on the first and second exposed gate regions. According to the present invention, a monolithically integrated Enhancement/Depletion mode HEMT having a uniform threshold voltage can easily be fabricated. The second barrier layer, which has a larger bandgap energy compared with those of other barrier layers and is used for the fabrication of an Enhancement-mode HEMT, plays a role of increasing the potential barrier height with respect to the gate electrode metal. The increased potential barrier height can make the total thickness of barrier layers required for the threshold voltage of the Enhancement-mode HEMT device thicker than that of a conventional Enhancement-mode HEMT. This improves the speed characteristic of the Enhancement-mode HEMT since the transistor has a decreased gate capacitance.

11 Claims, 7 Drawing Sheets

DEPLETION MODE (p-)HEMT DEVICE STRUCTURE    ENHANCEMENT MODE (p-)HEMT DEVICE STRUCTURE

US 6,670,652 B2

MONOLITHICALLY INTEGRATED E/D MODE HEMT AND METHOD FOR FABRICATING THE SAME

TECHNICAL FIELD

The present invention relates to a monolithically integrated Enhancement/Depletion (E/D) mode High-Electron Mobility Transistor (HEMT) and a pseudomorphic High-Electron Mobility Transistor (hereinafter referred to as '(p-)HEMT') and method for fabricating the same, and more particularly, to an E/D mode (p-)HEMT having a uniform threshold voltage on a monolithic substrate and method for fabricating the same.

BACKGROUND ART

In general, the HEMT or p-HEMT as a compound semiconductor device has excellent speed characteristics compared with those of electronic devices based upon silicon due to its excellent electron transport properties, and thus is widely used in microwave or millimeter-wave device applications operating in the frequency range between 10 GHz and 100 GHz. The (p-)HEMT device technology is very important because it has advantages such as the highest operational frequency among field effect transistors and the extremely low high-frequency noise. The (p-)HEMT device technology is applied for developing circuits or components for broadband wireless communication systems operating at millimeter-wave frequency or for high-speed optical communication systems operating at several tens of Gbps or more.

In general, the (p-)HEMT is divided into a depletion mode transistor having a negative value of threshold voltage $V_{Th}$ and an enhancement mode transistor having a positive value of threshold voltage $V_{Th}$. The depletion mode transistor is generally used in fabrication of a Monolithic Microwave Integrated Circuit (MMIC).

Figure 1A:
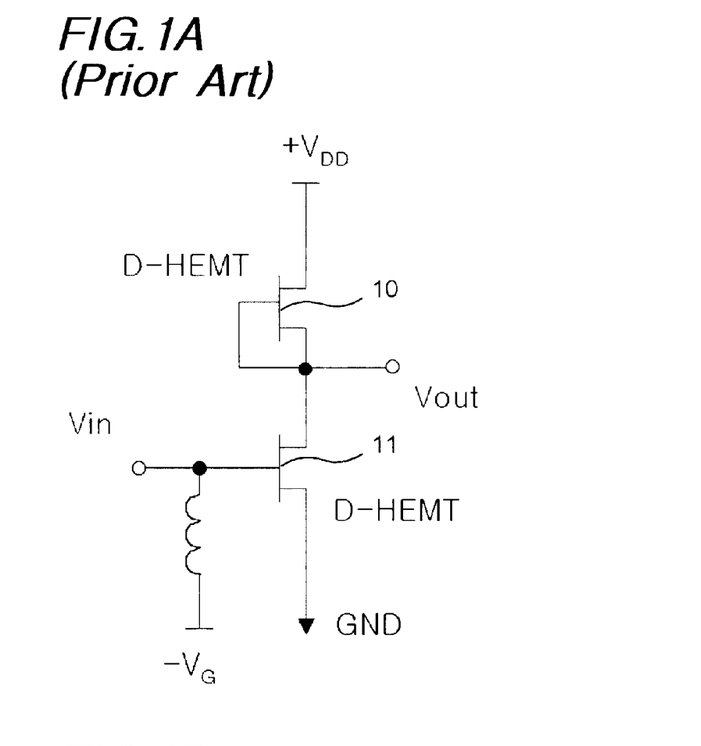
FIG. 1A is a circuit diagram of an inverter using depletion mode (p-)HEMTs only.

FIG. 1A is a circuit diagram of an integrated circuit using depletion mode (p-)HEMTs 10 and 11 only. Referring to FIG. 1A, two power supplies such as VDD having a positive voltage and $-V_G$ having a negative voltage are required in order to operate this circuit. Therefore, when a module for wireless communication terminals is fabricated using an integrated circuit composed of the depletion mode (p-)HEMTs 10 and 11 only, two power supplies are necessary thereby increasing the size of the module, which is a disadvantage when small-size and light-weighted wireless communication terminals are required. Therefore, in such occasions requiring light and miniature components such as in mobile communication terminals, it is necessary to adopt a device technology capable of fabricating a circuit that can be operated with a single power supply.

Figure 1B:
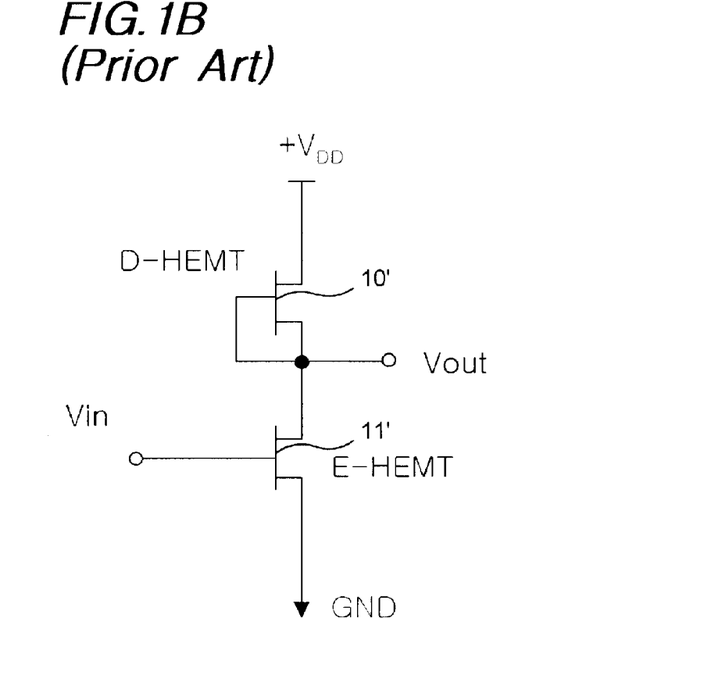
FIG. 1B is a circuit diagram of an inverter using a depletion mode (p-)HEMT and an enhancement mode (p-)HEMT.

FIG 1B is another example of a circuit diagram using a single power supply in order to overcome the disadvantage of FIG. 1A.

Referring to FIG. 1B, this circuit uses a combination of a depletion mode (p-)HEMT 10' and an enhancement mode (p-)HEMT 11'. However, monolithically integrating this circuit requires a device technology which can fabricate the depletion mode and enhancement mode (p-)HEMTs on a single substrate. In general, monolithic integration of the depletion and enhancement mode (p-)HEMTs can be embodied by adjusting the thickness of barrier layers.

Figure 2:
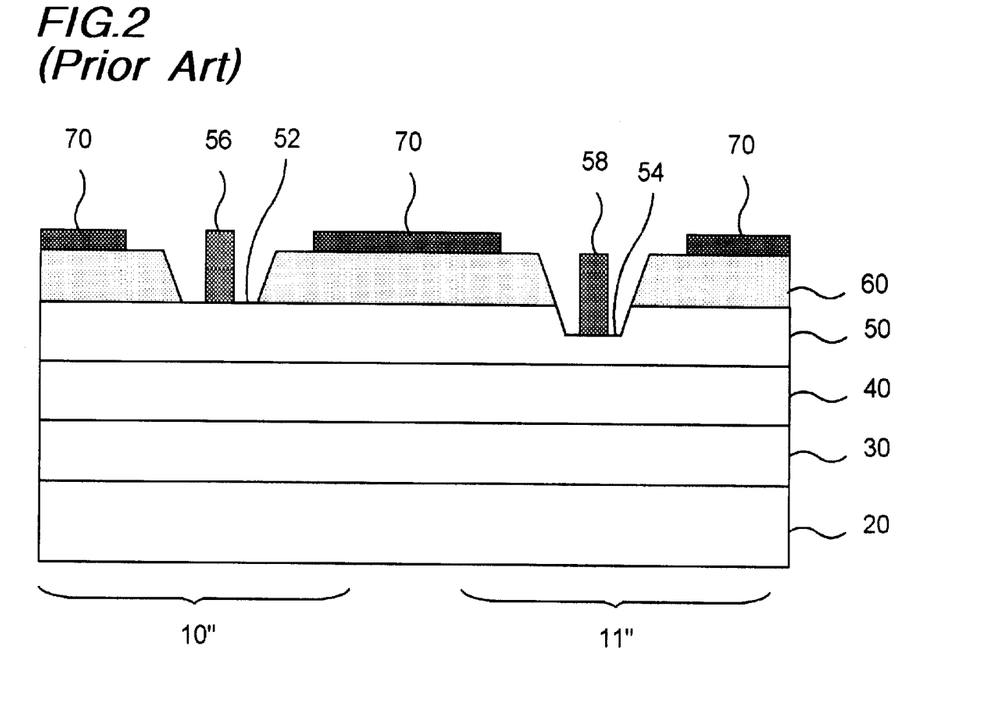
FIG. 2 is a cross-sectional view illustrating a monolithically integrated E/D mode (p-)HEMT of the prior art.

FIG. 2 is a cross-sectional view illustrating a monolithically integrated E/D mode (p-)HEMT disclosed in the circuit diagram of FIG. 1B.

Referring to FIG. 2, in order to fabricate a depletion mode (p-)HEMT, a gate pattern is formed using a photoresist, and then the ohmic layer 60 is etched selectively to expose the barrier layer 50 forming the exposed region 52. In this case, the thickness of the barrier layer 50 is thick enough to produce a negative threshold voltage required for a depletion mode (p-)HEMT operation. Then, a gate electrode metal 56 is formed on the region 52 exposed by etching the ohmic layer 60. Next, in order to form the enhancement mode (p-)HEMT, a gate pattern is formed by using the photoresist, and then an ohmic layer 60 is etched selectively to expose the barrier layer 50. The exposed barrier layer is further etched to form the exposed region 54. In this case, the thickness of the barrier layer 50 is thin enough to produce a positive threshold voltage required for a depletion mode (p-)HEMT operation. Then, a gate electrode metal 58 is formed on the exposed region 54.

Figure 3:
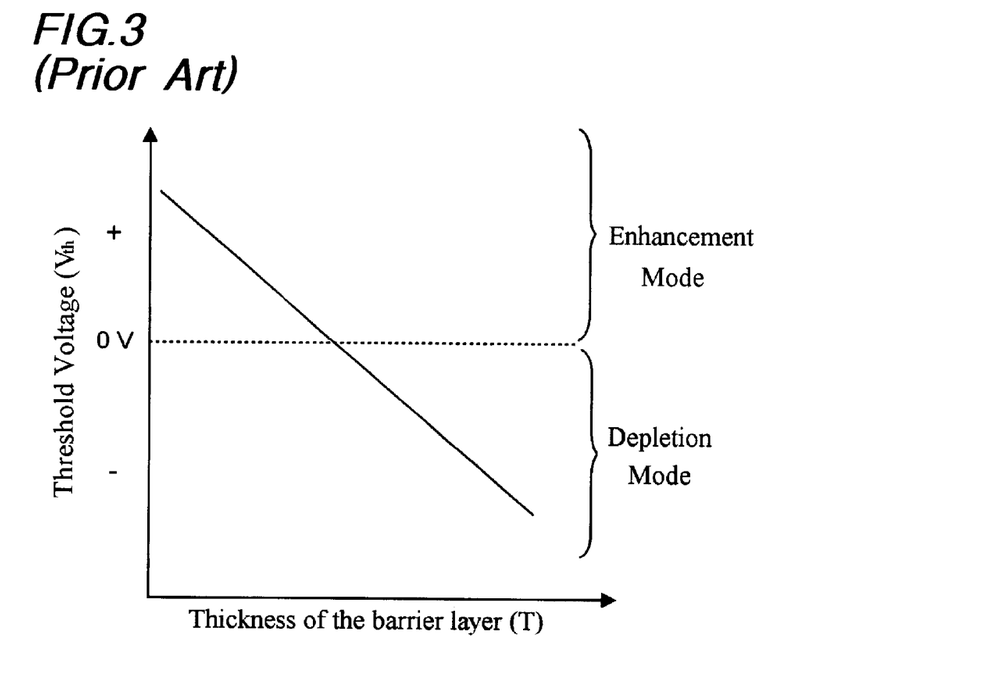
FIG. 3 is a graph illustrating a threshold voltage of (p-)HEMT as a function of the thickness T of a barrier layer.

FIG. 3 is a graph illustrating the dependence of the threshold voltage on the thickness T of the barrier layer 50 shown in FIG. 2. Referring to FIG. 3, as the thickness of the barrier layer 50 is increased, the threshold voltage becomes a negative value, and thus the (p-)HEMT operates in a depletion mode. On the contrary, as the thickness of the barrier layer 50 is decreased, the threshold voltage becomes a positive value, and thus the (p-)HEMT operates in an enhancement mode. Therefore, the E/D mode (p-)HEMT can be fabricated by adjusting the threshold voltage value, which can be implemented by controlling the thickness of the barrier layer 50.

In order to enhance the uniformity of device characteristics and thus the yield of an integrated circuit, an epitaxial structure and a barrier layer etching technique that can maintain the thickness of the barrier layer 50 uniformly and accurately are required. In the conventional depletion mode (p-)HEMT structure, the uniformity of the threshold voltage can be ensured in a relatively easy fashion because the thickness of the barrier layer of the depletion mode (p-)HEMT can be adjusted accurately by the following reason. When the ohmic layer 60 is etched to expose the barrier layer 50, it can be etched accurately by a selective wet etching or dry etching, since the ohmic layer subjected to etching is made of a material different from the barrier layer. However, in order to fabricate the enhancement mode (p-)HEMT the barrier layer made of the same material should be etched further to achieve a thin barrier layer required for a positive threshold voltage. Since the etching of the barrier layer is non-selective, accurate thickness control of the barrier layer is not easy and the thickness uniformity is poor, resulting in non-uniform threshold voltage. As a result, the yield of MMIC employing monolithically integrated E/D mode (p-)HEMTs is relatively low.

DISCLOSURE OF THE INVENTION

It is therefore an object of the present invention to provide a monolithically integrated E/D mode (p-)HEMT having a uniform threshold voltage by accurately adjusting the thickness of the barrier layer.

It is another object of the invention to provide a (p-)HEMT fabrication method suitable for obtaining the foregoing object.

To accomplish the above objects and other features, a monolithically integrated E/D mode (p-)HEMT structure is provided. The monolithically integrated E/D mode (p-)HEMT structure comprises: a buffer layer formed on a semi-insulating substrate; a channel layer formed on the buffer layer; a spacer layer formed on the channel layer; a first barrier layer, a second barrier layer, and a third barrier layer formed on the spacer layer in sequence; an ohmic layer formed on the third barrier layer; a first exposed gate region for a depletion mode (p-)HEMT formed by selective etching the ohmic layer such that the third barrier layer is exposed; a second exposed gate region an enhancement mode (p-)HEMT formed by selective etching the ohmic layer and the third barrier layer such that the second barrier layer is exposed; and gate electrodes respectively formed on the first exposed gate region and the second exposed gate region.

According to another aspect of the invention to accomplish the foregoing objects, a method for fabricating a monolithically integrated E/D mode HEMT is provided. The method comprises the steps of: forming a buffer layer, a channel layer, spacer layer, a first barrier layer, a second layer, a third layer, and an ohmic layer grown on a semi-insulating substrate in sequence; selectively etching the ohmic layer such that the third barrier layer is exposed to form a first exposed gate region; selectively etching the ohmic layer and the third barrier layer such that the second barrier is exposed to form a second exposed gate region; and forming gate electrodes on the first exposed gate region and the second exposed gate region, respectively.

BEST MODE FOR CARRYING OUT THE INVENTION

The following detailed description will be made about a preferred embodiment of the invention in reference to the accompanying drawings.

Figure 4:
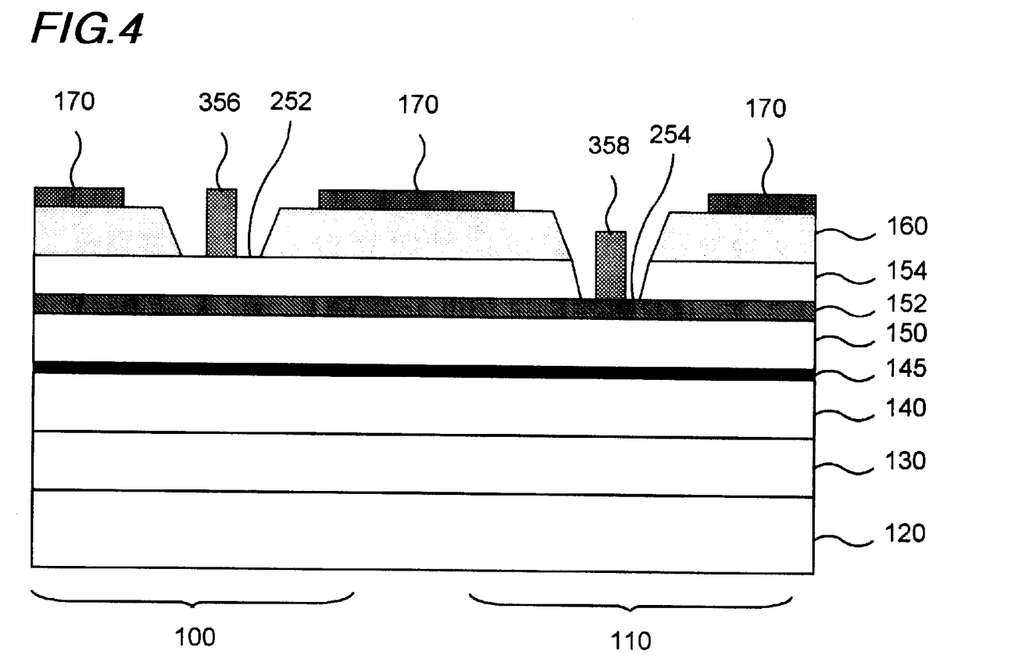
FIG. 4 is a cross-sectional view illustrating a monolithically integrated E/D mode (p-)HEMT of the invention.

FIG. 4 is a cross-sectional view illustrating a monolithically integrated E/D mode (p-)HEMT in accordance with the invention.

Referring to FIG. 4, on a GaAS semi-insulating substrate 120 a buffer layer 130 that is composed of either an undoped GaAs, or a GaAs/$Al_xGa_{1-x}As$ ($0<x\leq 1$) superlattice, or a combination of undoped GaAs and GaAs/$Al_xGa_{1-x}As$ ($0<x\leq 1$) superlattice is formed. On the buffer layer 130 a channel layer 140 that is composed of undoped GaAs in the case of an HEMT device or undoped $In_xGa_{1-x}As$ ($0<x\leq 0.35$) in the case of a p-HEMT device is formed.

On the channel layer 140 a spacer layer 145 that is composed of $In_{0.5}Ga_{0.5}P$ is formed. The spacer layer 145 prevents the decrease in electron mobility in the channel layer 140 due to scattering of electron by ionized impurities existing in the first barrier layer 150.

On the spacer layer 145 a first barrier layer 150, a second barrier layer 152, and a third barrier layer 154 in the order named are formed. Both of the first and third barrier layers 150 and 154 are made of $In_{0.5}Ga_{0.5}P$ that is lattice-matched to GaAs. In general, the barrier layers are n-type modulation doped, and doping profiles thereof can be different according to their structures, e.g. uniform doping structure, delta doping structure, a mixture of the uniform and delta doping structures and the like. The second barrier layer 152 is made of $In_xGa_{1-x}P$ ($0<x<0.5$) that is not lattice-matched to GaAs. The second barrier layer 152 is a strained layer, and should be formed thinner than a critical thickness that can be formed without generation of strain-induced dislocations. The critical thickness which can be formed without generation of strain-induced dislocations becomes thinner as the value x in $In_xGa_{1-x}P$ decreases from 0.5, but is thicker than 2 to 3 nm if the value x is about 0.8.

On the third barrier layer 154 a heavily n-type doped GaAs ohmic layer 160 for forming drain and source ohmic contacts of the (p-)HEMT is formed.

A depletion mode (p-)HEMT device has a gate electrode formed in the first exposed region that is formed by selectively etching the ohmic layer 160 such that the first barrier layer 152 is exposed. The first gate electrode 356 is generally composed of Ti, Pt, Au and the like. An enhancement mode (p-)HEMT device has an exposed region 254 generated by further selectively etching the third barrier layer 154 that is exposed after selectively etching the ohmic layer 160. On the exposed region 254 the second gate electrode 358 composed of Ti, Pt, Au and the like is formed.

Figure 5A:
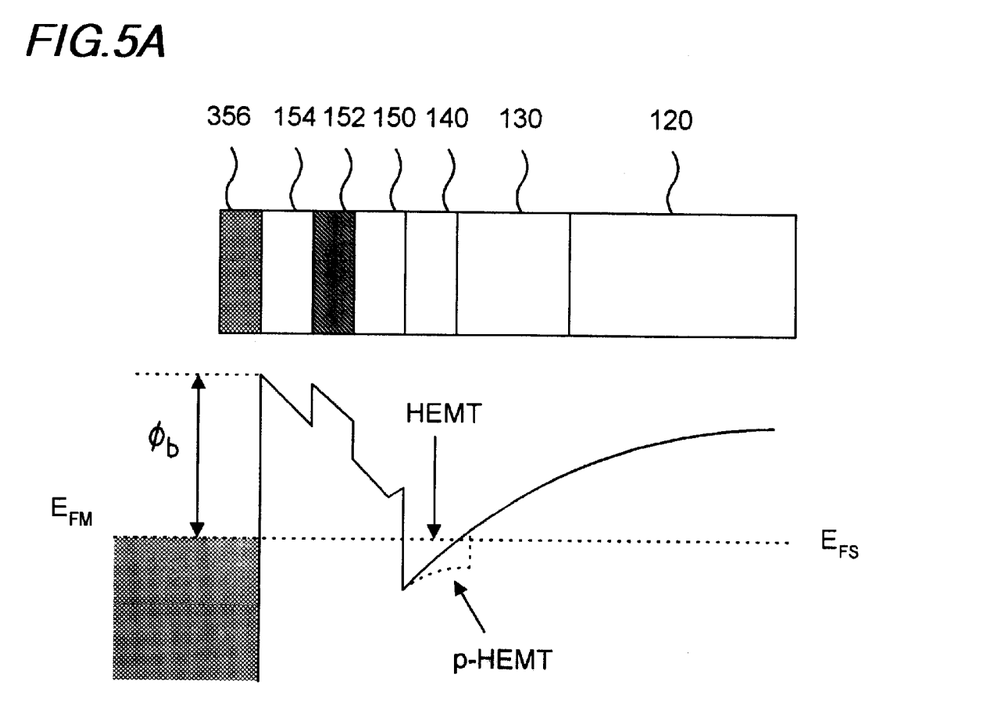
FIG. 5A is an energy band diagram of a depletion mode (p-)HEMT of the invention in an equilibrium state.
Figure 5B:
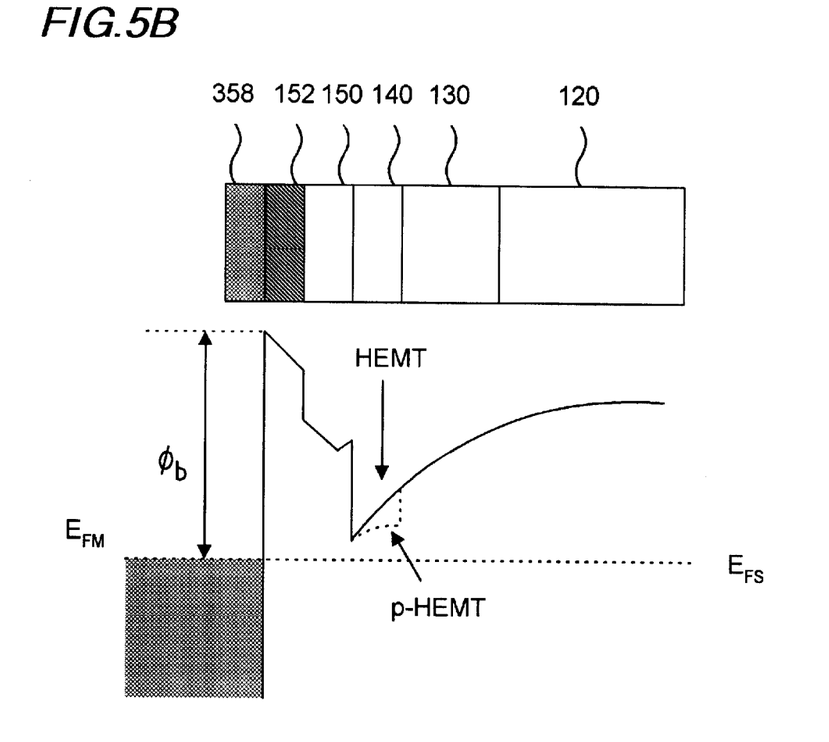
FIG. 5B is an energy band diagram of an enhancement mode (p-)HEMT of the invention in an equilibrium state.

FIG. 5A is an energy band diagram of a depletion mode (p-)HEMT in an equilibrium state and FIG. 5B is an energy band diagram of an enhancement mode (p-)HEMT in an equilibrium state.

Referring to FIG. 5B, the second barrier layer 152 made of $In_xGa_{1-x}P$ ($0<x<0.5$) functions as an etching stop layer for selectively etching the third barrier layer 154 in a uniform manner as well as increases the height of the Schottky barrier $\Phi_b$ formed between the second barrier layer 152 and the gate electrode metal. Since the height of the Schottky barrier $\Phi_b$ formed between the second barrier layer 152 and the gate electrode metal is larger than that formed between the first barrier layer 150 made of $In_{0.5}Ga_{0.5}P$ and the gate electrode metal, the thickness of the whole barrier layers required for fabrication of the enhancement mode (p-)HEMT is increased.

The increased thickness of the entire barrier layers decreases the gate capacitance of the enhancement mode (p-)HEMT, thereby enhancing speed characteristics of the enhancement mode (p-)HEMT device.

According to the monolithically integrated E/D mode InGaP/(In)GaAs (p-)HEMT device of the invention, the barrier layers of the enhancement mode (p-)HEMT is precisely adjustable in thickness thereby enabling fabrication of a monolithically integrated E/D mode InGaP/(In)GaAs (p-)HEMT device having a uniform threshold voltage.

Further, the monolithically integrated E/D mode InGaP/(In)GaAs (p-)HEMT device of the invention increases the Schottky barrier height formed between the gate electrode metal and the barrier layer, resulting in a increase in the thickness of the entire barrier layers for obtaining the threshold voltage of the enhancement (p-)HEMT device. The increased barrier layer thickness can reduce the gate capacitance of the enhancement (p-)HEMT device, improving the speed characteristics of the transistor.

FIGS. 6A to 6G are cross-sectional views illustrating a method of fabricating the monolithically integrated E/D mode InGaP/(In)GaAs (p-)HEMT shown in FIG. 4.

Figure 6A:
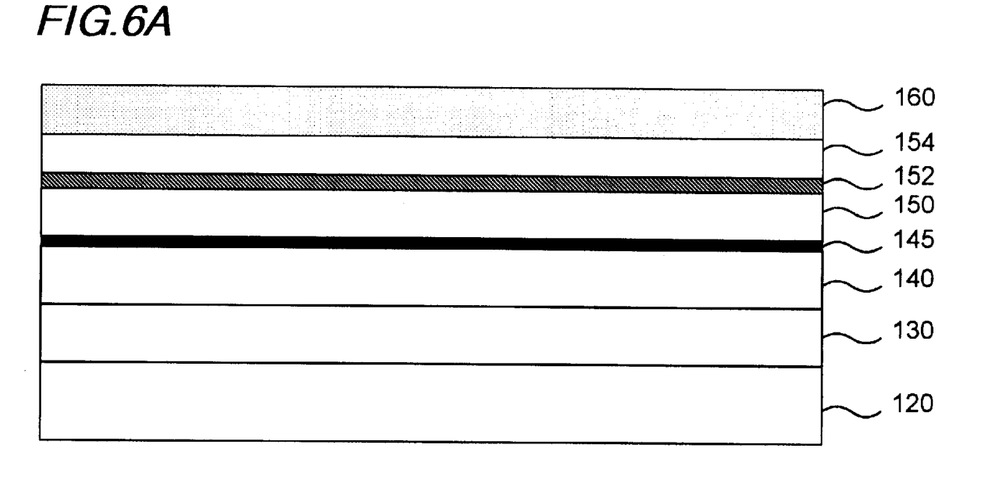
FIGS. 6A to 6G are cross-sectional views illustrating a fabrication method of a monolithically integrated E/D mode (p-)HEMT of the invention.

FIG. 6A is a cross-sectional view illustrating the epitaxial layer structure of the monolithically integrated E/D mode InGaP/(In)GaAs (p-)HEMT comprising the semi-insulating substrate 120, the buffer layer 130, the channel layer 140, the spacer layer 145, the first barrier layer 150, the second barrier layer 152, the third barrier layer 154, and the ohmic layer 160. The buffer layer 130, the channel layer 140, the spacer layer 145, the first barrier layer 150, the second barrier layer 152, the third barrier layer 154, and the ohmic layer 160 are grown on the semi-insulating substrate 120 in sequence.

Figure 6B:
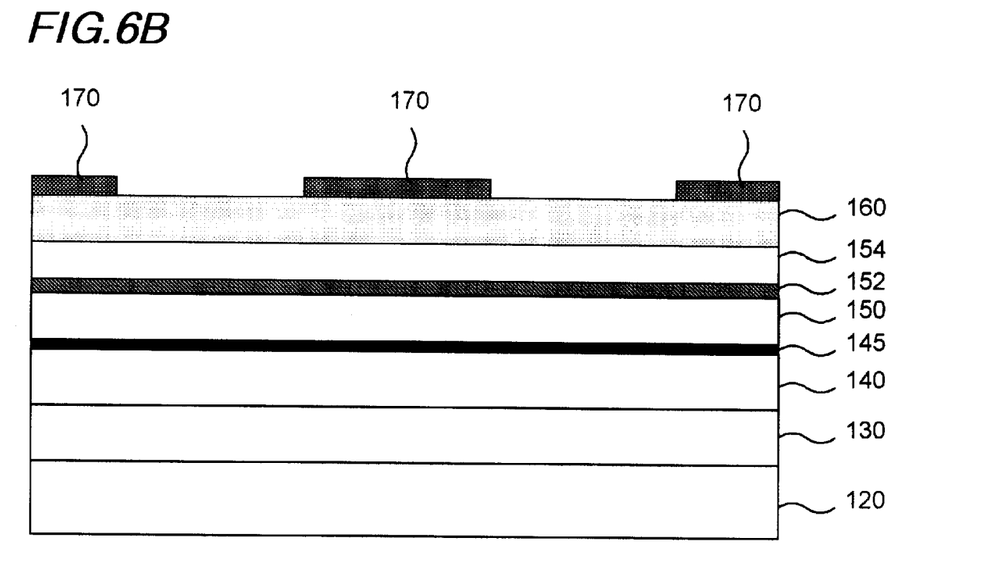

FIG. 6B is a cross-sectional view illustrating steps of forming the source and drain ohmic pattern. First, the ohmic layer 160, the third barrier layer 154, the second barrier layer 152, the first barrier layer 150, the spacer layer 145, the channel layer 140, and the buffer layer 130 are partially etched using a photoresist of a mesa pattern of the E/D mode (p-)HEMT as a mask to electrically isolate each device. After the source and drain ohmic pattern is formed using the photoresist, a source drain ohmic metal pattern is formed via a vacuum deposition and a lift-off process, and then source and drain ohmic contacts 170 are formed via a rapid thermal annealing (RTA).

Figure 6C:
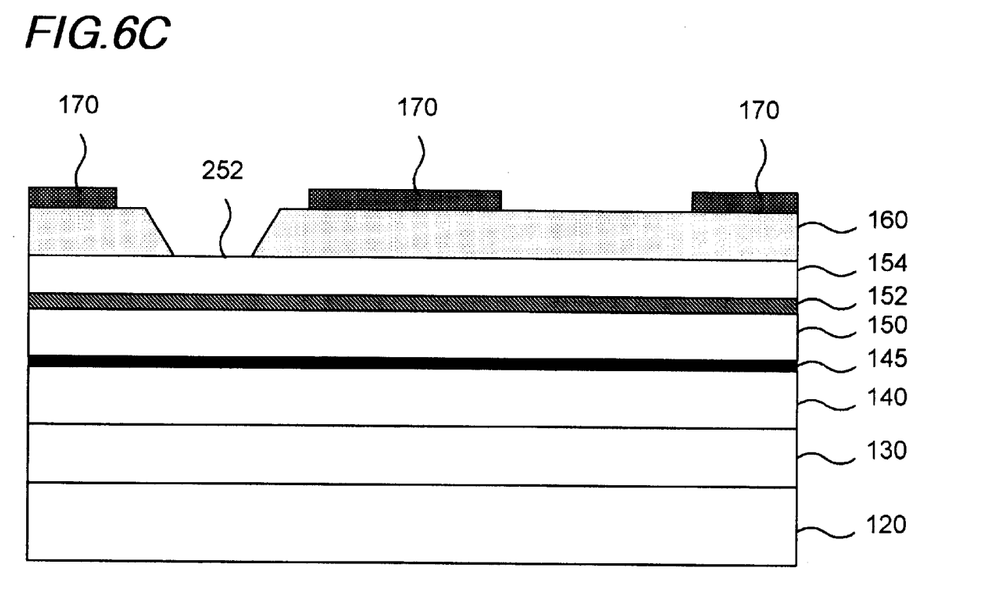
Figure 6D:
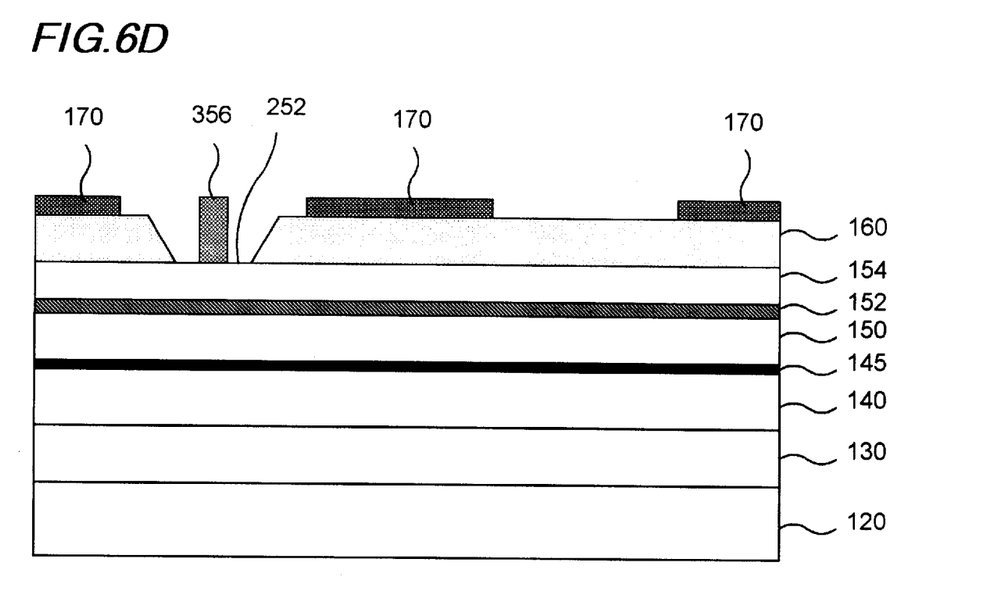

FIGS. 6C and 6D are sectional views illustrating steps of fabricating the depletion mode (p-)HEMT device 100. First, a gate pattern is formed on the mesa pattern of the depletion mode (p-)HEMT 100 using the photoresist to selectively etch the ohmic layer 160 above the third barrier layer 154. If a selective etching solution such as a $H_2SO_4:H_2O_2:H_2O$-based solution or a $H_3PO_4:H_2O_2:H_2O$-based solution is used, the etching rate of the ohmic layer 160 made of GaAs is at least 100 times faster than that of the third barrier layer 154 made of InGaP that the third barrier layer is rarely etched. Even if over-etching takes place, the thickness of the third barrier layer 154 is rarely changed thereby enabling fabrication of the depletion mode (p-)HEMT having uniform and accurate threshold voltage characteristics.

Then, after the gate etching, the gate electrode metal 356 composed of Ti, Pt, Au and the like are vacuum deposited on the exposed region 252 formed on the third barrier layer 154 and a gate is formed via a lift-off process to complete fabrication of the depletion mode (p-)HEMT 100.

Figure 6E:
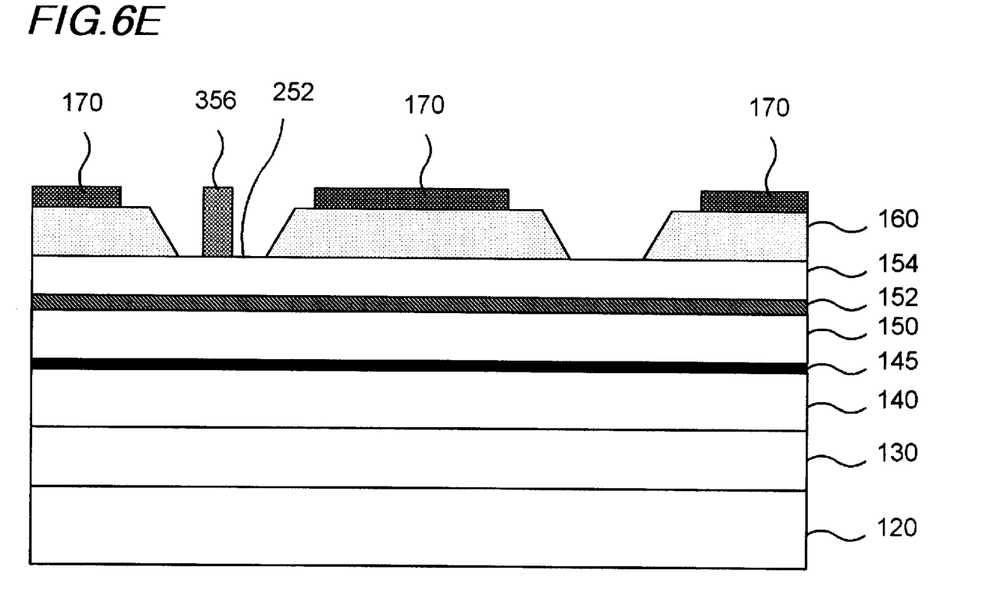
Figure 6F:
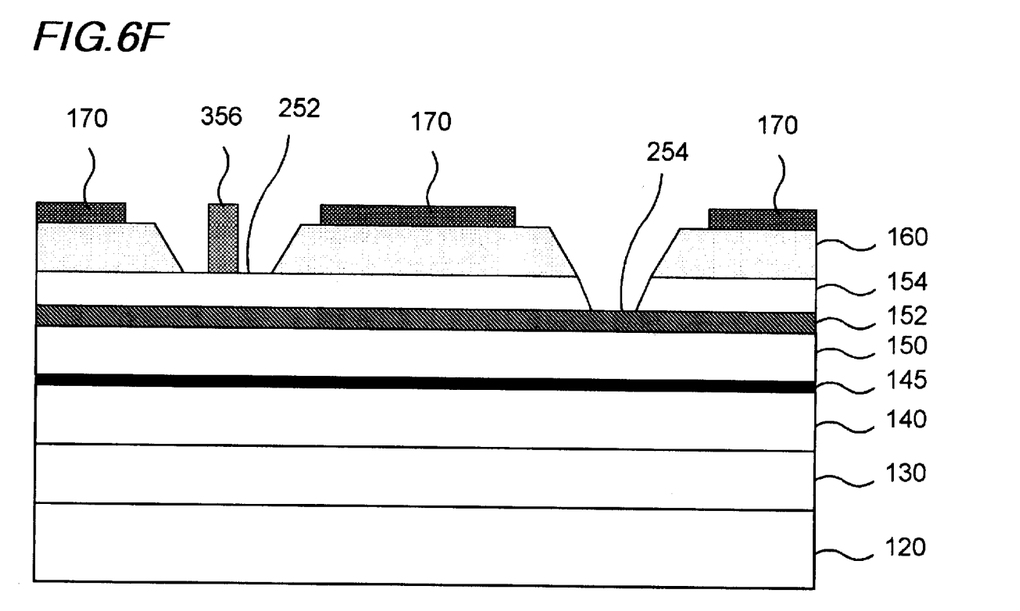
Figure 6G:
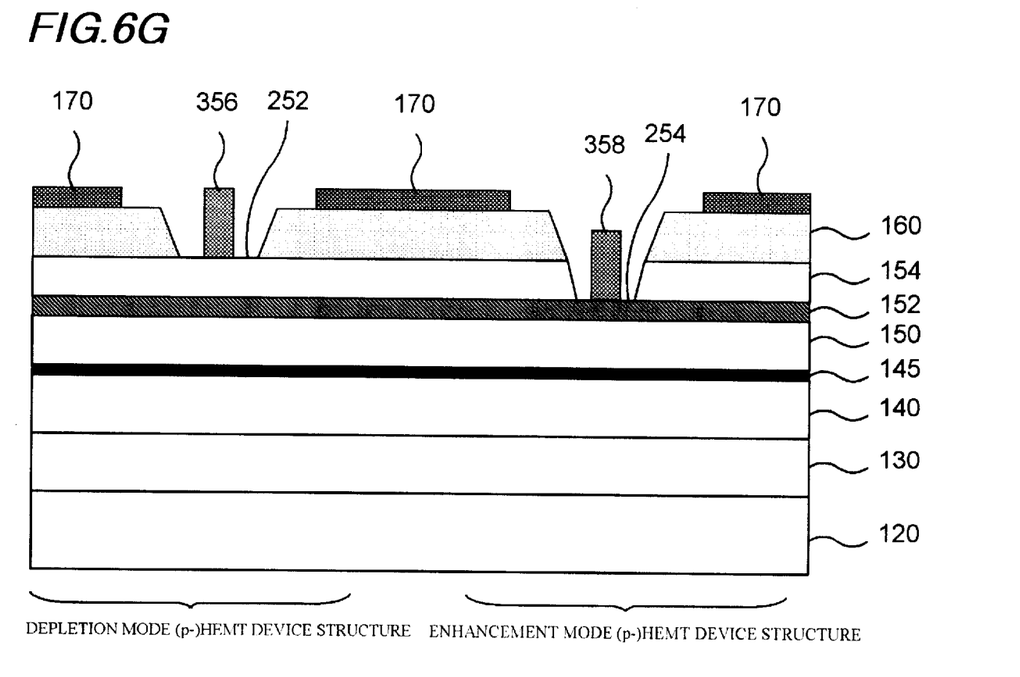

FIGS. 6E to 6G are cross-sectional views illustrating steps for fabricating an enhancement mode (p-)HEMT device 110. First, the gate pattern is formed on the mesa pattern of the enhancement mode (p-)HEMT using the photoresist to selectively etch ohmic layer 160 above the third barrier layer 154. Available examples of a selective etching solution include the $H_2SO_4:H_2O_2:H_2O$-based or $H_3PO_4:H_2O_2:H_2O$-based solution used for the fabrication of the depletion mode (p-)HEMT. Then, the ohmic layer 160 is etched, and the exposed third barrier layer 154 is selectively etched against the second barrier layer 152. Available examples of a selective etching solution of the third barrier layer 154 against the second barrier layer 152 include an $HCl:H_2O$-based or $H_3PO_4:HCl$-based solution. Selectivity of the etching solution increases as the value x of $In_xGa_{1-x}P$ (0<x<0.5) composing the second barrier layer 152 approaches 0. When the value x is sufficiently small, the etching solution rarely etches the second barrier layer 152. Even if over-etching takes place, the thickness of the second barrier layer 152 is rarely changed, thereby enabling fabrication of the enhancement mode (p-)HEMT having uniform and accurate threshold voltage characteristics.

After the gate etching, the gate electrode metal composed of Ti, Pt, Au and the like is vacuum deposited on the exposed region 254 and the gate electrode metal 358 is formed via the lift-off process so as to complete the monolithically integrated E/D (p-)HEMT shown in FIG. 4.

Industrial Applicability

The present invention enables fabrication of the monolithically integrated E/D mode (p-)HEMT device having the uniform characteristics through a very simple and economical selective etching, improving the yield of MMICs utilizing the monolithically integrated E/D mode (p-)HEMT device. The second barrier layer of the enhancement mode (p-)HEMT increases the potential barrier height formed between the gate electrode metal and the second barrier layer, which can increase the thickness of the total barrier layer for obtaining the required threshold voltage of the enhancement (p-)HEMT device. The increased total barrier layer thickness reduces the gate capacitance, improving the speed characteristics of the enhancement (p-)HEMT device.

What is claimed is:

1. A monolithically integrated E/D mode (p-)HEMT comprising:

a buffer layer formed on a semi-insulating substrate;

a channel layer formed on said buffer layer;

a spacer layer formed on said channel layer;

a first barrier layer, a second barrier layer, and a third barrier layer sequentially formed on said spacer layer;

an ohmic layer formed on said third barrier layer;

a first exposed gate region formed by etching said ohmic layer such that said third barrier layer is exposed;

a second exposed gate region formed by etching said ohmic layer and said third barrier layer such that said second barrier layer is exposed; and gate electrodes, respectively, formed on said first exposed region and said second exposed region, wherein said first barrier layer is made of an n-type impurity-doped $In_{0.5}Ga_{0.5}P$ that is lattice-matched to GaAs.

2. The monolithically integrated E/D mode (p-)HEMT of claim 1, wherein said substrate is a semi-insulating GaAs substrate.

3. The monolithically integrated E/D mode (p-)HEMT of claim 1, wherein said buffer layer is made of an undoped GaAs, or a $GaAs/Al_xGa_{1-x}As$ (0<x≦1) superlattice, or a mixture of an undoped GaAs and $GaAs/Al_xGa_{1-x}As$ (0<x≦1) superlattice.

4. The monolithically integrated E/D mode HEMT of claim 1, wherein said channel layer is made of an undoped GaAs.

5. The monolithically integrated E/D mode p-HEMT of claim 1, wherein said channel layer is made of an undoped $In_xGa_{1-x}As$, wherein x is 0 to 0.35.

6. The monolithically integrated E/D mode (p-)HEMT of claim 1, wherein said spacer layer is made of an undoped $In_{0.5}Ga_{0.5}P$.

7. The monolithically integrated E/D mode (p-)HEMT of claim 1, wherein said second barrier layer is made of a strained n-type impurity-doped $In_xGa_{1-x}P$, wherein x is 0 to 0.5.

8. The monolithically integrated E/D mode (p-)HEMT of claim 1, wherein said second barrier layer is made of a strained undoped $In_xGa_{1-x}P$, wherein x is 0 to 0.5.

9. The monolithically integrated E/D mode (p-)HEMT of claim 1, wherein said third barrier layer is made of an n-type impurity doped $In_{0.5}Ga_{0.5}P$ that is lattice-matched to GaAs.

10. The monolithically integrated E/D mode (p-)HEMT of claim 1, wherein said third barrier layer is made of an undoped $In_{0.5}Ga_{0.5}P$ that is lattice-matched to GaAs.

11. The monolithically integrated E/D mode (p-)HEMT of claim 1, wherein said ohmic layer is made of a high-concentration n-type doped GaAs.

* * * * *

UNITED STATES PATENT AND TRADEMARK OFFICE
CERTIFICATE OF CORRECTION

PATENT NO.     : 6,670,652 B2                                      Page 1 of 1
DATED          : December 30, 2003
INVENTOR(S)    : Song It is certified that error appears in the above-identified patent and that said Letters Patent is hereby corrected as shown below:

Column 1,
Line 41, "as VDD having" should read -- as $V_{DD}$ having --.

Signed and Sealed this

Twenty-seventh Day of July, 2004

JON W. DUDAS
*Acting Director of the United States Patent and Trademark Office*